United States Patent [19]

Yeh

[11] Patent Number: 4,719,635
[45] Date of Patent: Jan. 12, 1988

[54] FREQUENCY AND PHASE LOCKING METHOD FOR LASER ARRAY

[75] Inventor: Pochi A. Yeh, Thousand Oaks, Calif.

[73] Assignee: Rockwell International Corporation, El Segundo, Calif.

[21] Appl. No.: 827,564

[22] Filed: Feb. 10, 1986

[51] Int. Cl.$^4$ .............................................. H01S 3/10
[52] U.S. Cl. ........................................ 372/50; 372/32; 372/45; 372/108
[58] Field of Search ....................... 372/50, 45, 46, 18, 372/29, 32, 108

[56] References Cited

U.S. PATENT DOCUMENTS

| | | | |
|---|---|---|---|
| 3,996,492 | 12/1976 | McGroddy | 372/44 |
| 3,996,528 | 12/1976 | Blum et al. | 372/44 |
| 4,163,953 | 8/1979 | Springthorpe et al. | 372/50 |

Primary Examiner—James W. Davie
Attorney, Agent, or Firm—H. Fredrick Hamann; Craig O. Malin; John J. Deinken

[57] ABSTRACT

A system and method are described for establishing a common operating frequency and phase for the lasers in a two-dimensional array, each of which has an actual frequency which deviates from a common nominal frequency. A waveguide structure is placed in the path of the beams emitted from the various lasers, and a plurality of optical gratings are provided in the waveguide in alignment with the laser beams to deflect portions of the beams into propagation along the waveguide and into cross-coupling with the other lasers in the array. The periodic gratings are characterized by grating periods substantially equal to $\lambda/n_1$, and the thickness of the waveguide core is at least equal to approximately $\lambda/(4\sqrt{n_2^2-n_3^2})$, where $\lambda$ is the wavelength of the guided mode, $n_1$ is the effective refractive index for the guided mode, and $n_2$ and $n_3$ are the refractive indices for the waveguide core and substrate, respectively. Two-dimensional coupling is achieved either by waveguide coupling in one direction and evanescent coupling in the other direction, or by a pair of gratings for each laser beam at angles to each other to produce waveguide coupling in both directions.

20 Claims, 4 Drawing Figures

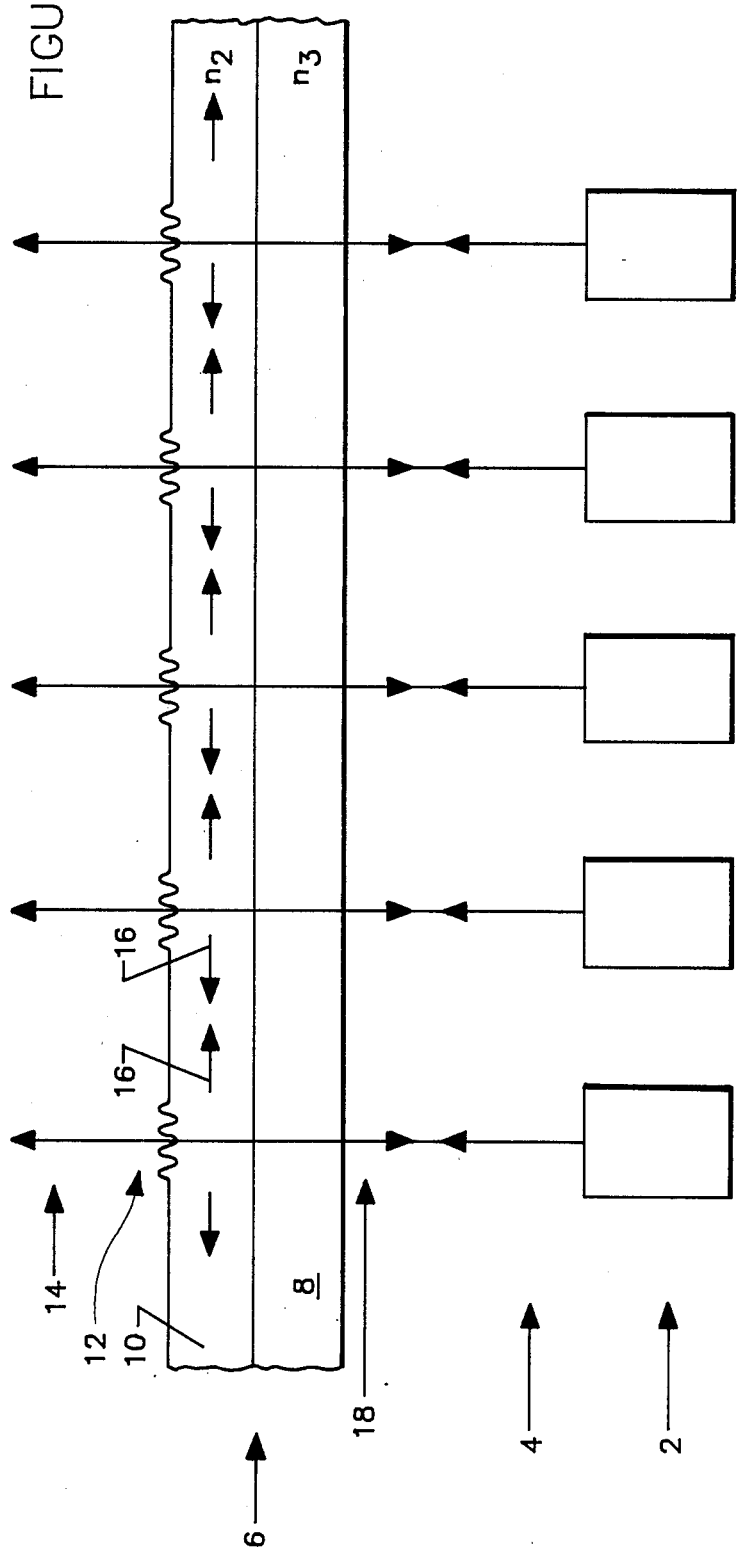

FREQUENCY AND PHASE LOCKING METHOD FOR LASER ARRAY

BACKGROUND OF THE INVENTION

The invention relates to laser control systems, and more particularly to a technique for establishing a common frequency and phase for a two-dimensional array of lasers which are characterized by a uniform nominal frequency but individual operating frequencies which vary from nominal.

High power phased-array injection lasers have recently become a target of investigation for researchers in the area of optoelectronics. One purpose of these investigations is to obtain a coherent high power output beam for various applications. If a coherent addition of the individual laser outputs into a single high power beam is desired, the frequencies and relative phases of the individual beams must be locked together. Unfortunately, no method has previously been found for controlling the relative phases of phased-array lasers. For example, with gallium arsenide (GaAs) lasers having a nominal frequency of approximately $10^{14}$ Hz, the typical frequency variation encountered among lasers formed from the same processing facility is on the order of several gigahertz, while GaAs lasers manufactured by different companies using different growth techniques can vary from the nominal frequency by hundreds of gigahertz. Often each laser itself selects phases so as to minimize its threshold current, and in many cases these phases are the undesirable ones. See, e.g., Streifer, et. al., "Phased Array Diode Lasers", Laser Focus, Page 100 (June 1984).

Semiconductor lasers such as GaAs lasers are rapidly assuming a prominent role among all lasers. Because of their small size and inherent design flexibility, semiconductor lasers are useful for wide areas of applications. The problem of phase locking the outputs from a multitude of semiconductor lasers is thus becoming increasingly important.

It has previously been found that, if a number of lasers are placed close enough together, an "evanescent" wave will be formed outside the confines of the individual beams, resulting in an energy coupling between adjacent lasers that causes the various lasers to lock together in frequency and phase, if they are close enough to each other. To date it has been possible to produce evanescent coupling only for linear arrays; some mechanism is still necessary to lock together the frequency and phase of the various lasers in a two-dimensional array.

SUMMARY OF THE INVENTION

In addressing these problems with the prior art, the present invention provides a novel technique for establishing a common frequency and phase among an array of lasers which are characterized by individual operating frequencies that vary from a common nominal frequency. The inventive technique is applicable to semiconductor lasers in a two-dimensional array. A portion of the laser power is diverted to establish a common frequency and phase, with the amount of diverted power varying in accordance with the frequency deviation from nominal.

In an illustrative embodiment of the invention, a waveguide structure is positioned in the path of the beams emitted by the lasers in the array, with a plurality of optical gratings in the waveguide structure adapted to deflect portions of the beam into propagation along the waveguide. The thickness of the waveguide structure and the lengths of the grating periods are selected to establish the desired guided propagation. In addition to deflecting portions of the beams into the waveguide, each grating deflects a portion of the previously guided signals from other gratings into its associated laser, thus establishing a cross-coupling among the various lasers that forces a single operating frequency and phase.

To establish this cross-coupling, the grating periods are set substantially equal to $\lambda/n_1$ and the thickness of the waveguide core is at least equal to approximately $\lambda/(4\sqrt{n_2^2-n_3^2})$, where $\lambda$ is the wavelength of the guided mode, $n_1$ is the effective index of refraction for the guided mode, and $n_2$ and $n_3$ are the respective indices of refraction for the waveguide core and for the substrate which supports the core. The optical gratings may be provided as a series of physical corrugations in a surface of the waveguide, as holographic gratings, or by some other beam deflection mechanism. The effective grating depths are established in positive proportion to the deviation between the desired nominal frequency and the individual laser operating frequencies, such that the amount of beam power deflected by the gratings is correlated with the amount of frequency deviation to be overcome. The period for each grating may be set at a constant level to produce a single guided mode, or it may be varied along the grating if a plurality of different guided modes is desired.

One of the principal advantages of the invention is that it achieves cross-coupling and a resulting frequency and phase locking among the various lasers in a two-dimensional array, rather than being limited to a linear array. In one embodiment this two-dimensionality is achieved with semiconductor lasers by positioning the lasers close enough to each other in one direction to establish a common operating frequency and phase for adjacent lasers in that direction by means of evanescent coupling between adjacent lasers, with the waveguide gratings oriented to establish a common operating frequency and phase among the lasers in another direction. Alternatively, a plurality of gratings may be provided in the waveguide in alignment with each laser beam, with the gratings for each beam oriented so as to deflect portions of the beam along the two desired directions. For deflection in an x-y array of lasers, a pair of gratings can be provided in alignment with each array along the opposed surfaces of the waveguide structure.

The invention is particularly suited for use with semiconductor lasers. For this purpose the waveguide core may advantageously comprise a thin film deposited on a transparent substrate, and the entire structure may be monolithically integrated with the laser array itself.

DESCRIPTION OF THE DRAWINGS

Additional features and advantages of the invention will be apparent to those skilled in the art from the following detailed description, which refers to the accompanying drawings, in which:

FIG. 1 is a schematic illustration of a laser array and a cross-coupling waveguide structure constructed in accordance with the present invention for establishing a common frequency and phase for the various lasers in the array;

FIG. 2 is an enlarged elevational view illustrating the grating used to deflect portions of a laser beam into and out of the waveguide;

DESCRIPTION OF THE INVENTION

Figure 3:
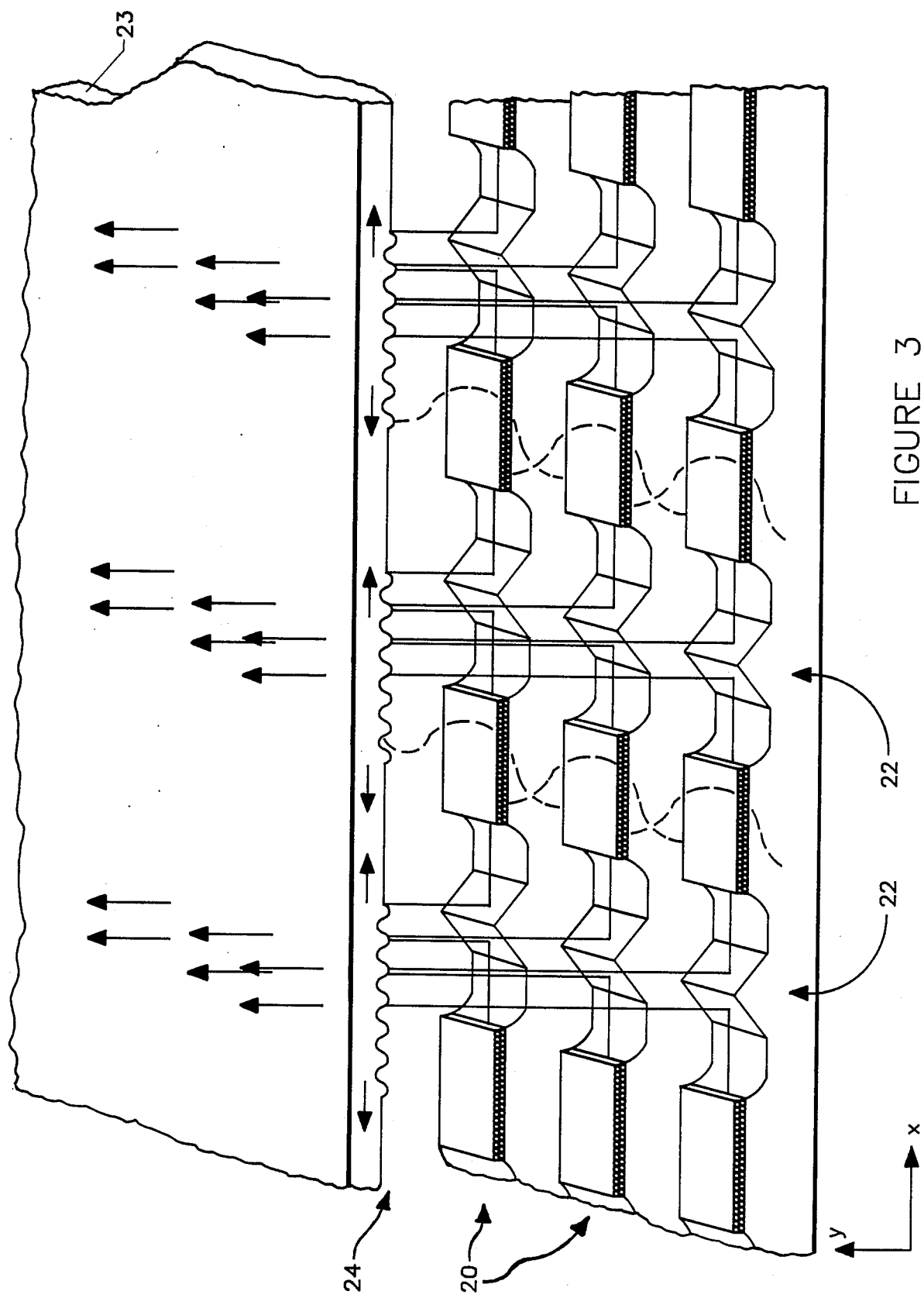
FIG. 3 is a fragmentary perspective view of a laser array and waveguide structure illustrating the achievement of laser cross-coupling in one dimension by evanescent coupling, and in the other dimension by means of a waveguide.

The basic operating principles of the invention are illustrated in FIG. 1, in which an array of lasers 2 are shown which may be, for example, gallium arsenide (GaAs) semiconductor lasers producing beams with a nominal wavelength of approximately 8500 angstroms. The emitted laser beams 4 are directed towards a waveguide structure 6 consisting of a substrate 8 which is substantially transparent to the laser beams, and a waveguide core 10 carried on and supported by the substrate. Various techniques such as thin film deposition can be used to form the waveguide core over the substrate. A good reference which discusses thin film deposition techniques is Yariv & Yeh, "Optical Waves in Crystals", Pages 405-503 (John Wiley & Sons, 1984). With GaAs semiconductor lasers, the substrate can be a transparent glass and the core can comprise a thin film of another glass with a higher index of refraction. For this purpose a metal can be diffused into the core glass to attain a "flint" glass with a higher index of refraction. The core index of refraction is denoted herein as $n_2$, while the substrate index of refraction is referred to as $n_3$. The waveguide structure can also be characterized by an "effective" index of refraction $n_1$ which takes into account the fact that guided light will normally not be entirely confined within the core, but rather will be influenced by the substrate on one side of the core and by the air contacting the other side of the core. The "effective" index of refraction $n_1$ is a weighted combination of the indices of refraction for the core, substrate and air, and is normally less than $n_2$ but greater than $n_3$.

The waveguide core 10 includes a series of optical gratings 12 on one surface formed in alignment with the respective laser beams 4. As explained in further detail below, the waveguide structure is configured so that the gratings 12 deflect a portion of their respective laser beams into guided propagation along the waveguide core 10. While a majority of each laser beam is transmitted through and out of the waveguide structure without substantial deflection, as indicated by arrows 14, a lesser portion of each laser beam is deflected both left and right into the waveguide, as indicated by the arrows 16. Typically, the deflected portion will amount to a few percent of the total beam.

As the guided portion of each beam travels past the grating for another beam, a portion of the guided beam is deflected by the second grating into the laser for that grating, a phenomenon indicated by the downward directed arrows 18. Successive portions of the guided beam originating from each laser are deflected into the other lasers as the beam continues propagating along the waveguide. Since the various gratings produce a similar treatment for the deflected portions of the beam from each of the lasers, cross-coupling is established among the various lasers whereby portions of their beams are deflected into the other lasers in the array. This cross-coupling has been found to effectively lock the various lasers onto a common frequency and phase, despite individual deviations among the various lasers from the common nominal frequency.

The discovery of structural criteria that result in the cross-coupling just described comprises an important part of the present invention. These criteria include $n_1$, $n_2$, $n_3$, the thickness t of the waveguide core, the propagation constant $\beta$ of the guided mode, and the period $\Lambda$ of the various gratings.

An enlarged view of the waveguide core at the location of one of the gratings 12 is illustrated in FIG. 2. The grating is depicted as a series of sinusoidal corrugations in the upper surface of the core having a period $\Lambda$. The thickness of the waveguide core is given as t. The guided portion 16 of one of the laser beams deflects off the boundaries of the waveguide core as it propagates down the core. The guided beam deflects off the grating 12 at an angle A with respect to the incoming laser beam 4. The deflected portion 18 of the guided beam which is directed into the laser for grating 12 is shown by a dashed line. Although the deflected beam 18 is illustrated as being adjacent to the incoming laser beam 4, in actuality it would be substantially coaxial with the incoming beam.

The relationships which establish the conditions necessary for cross-coupling and a uniform laser frequency and phase are:

$$\Lambda = 2\pi/\beta = \lambda/n_1 \qquad (1)$$

$$t = \lambda/(4\sqrt{n_2^2 - n_3^2}) \qquad (2)$$

These relationships apply to both the magnetic (TM) and electric (TE) modes of propagation, each of which is characterized by its unique $\beta$. (Equation 2) represents the core thickness at the cutoff for the $TEM_{0,0}$ mode. This is the minimum thickness allowable for the core; if additional propagation modes are desired, the core thickness can be increased correspondingly.

The depths of the gratings should be great enough to ensure that adequate power is deflected from the laser beams into the waveguide to establish a cross-coupling sufficient to set up a common laser frequency and phase, but should not be substantially greater than this minimum, so as to avoid any unnecessary loss of power. The required grating depths increase, with a corresponding increase in the amount of deflected power, as the deviation between the nominal frequency and the actual laser operating frequency increases. Typical grating depths are in the approximate range 10%-20% of the core thickness t.

If propagation in more than one mode is desired, the grating period can be varied somewhat within each grating, so that different portions of the same grating have periods which correspond to the propagation constants of the various desired modes. The provision of a waveguide structure having a varying dimension to respond to different modes is commonly referred to as "chirping".

Numerous techniques may be used to form the optical gratings 12. The gratings may consist of physical corrugations in the waveguide core, as illustrated in FIG. 2, or they may be formed as "holographic" gratings. In the latter approach, two laser beams are superimposed at an angle to each other upon the waveguide surface to form an interference pattern. The pattern is then processed to form an optical grating which may not have physical corrugations. When a series of corrugated ridges and cuts are used to define the grating, their actual profile may assume various forms, such as triangular, square, or otherwise. The corrugations may be formed by a number of different methods, such as electron or ion beam implantation, photolithography, or the use of etchants. Relative changes of refractive index on the order of a few percent as a result of ion implantation have been reported. See, e.g., Townsend, SPIE Proceedings, New Optical Materials, Page 88 (Geneva, Switzerland, April, 1983). Highly accurate, computer controlled ion beams with resolutions of nearly 500 angstroms and a scanning capability over reasonably large areas have also been made commercially available from firms such as Microbeam, Inc. of Newbury Park, Calif. The selection of the particular ion species and their energies will determine the strength of the grating.

The embodiment of the invention illustrated in FIGS. 1 and 2 utilizes laser beams oriented perpendicular to the waveguide core. Other relative angles between the laser beams and waveguide structure could also be used, since each grating will have a limited acceptance angle within which a portion of an incident laser beam will be deflected into propagation along the waveguide core, while the remainder of the beam will be transmitted out of the waveguide. The acceptance angle for a particular grating will generally depend upon the period and profile of the grating corrugations. With a 90° orientation between the beam and grating, the grating will generally have only one order of diffraction, which will be along the waveguide core. For a lesser incident angle, such as 60°, there may be two or more orders of diffraction, only one of which will be along the waveguide. An exception to this is the "blazed" grating, which will have only a single order of diffraction even when the incident angle of the laser beam is less than 90°.

As noted, the strength of the cross-coupling among the various lasers will be determined by the depth of modulation in the gratings. For a given strength of cross-coupling, there correspnds a frequency band within which all of the lasers can be locked together in frequency and phase. In other words, if the frequency differences between the lasers are within the bandwidth, the frequencies and phases of these lasers will be locked together.

The invention is particularly applicable to semiconductor lasers, which presently have an effective power limitation of approximately 50 milliwatts per laser. Considerably higher power lasers may be formed by using the present invention to combine the outputs of a number of semiconductor lasers with a common frequency and phase. A two-dimensional semiconductor laser array which uses the invention to lock the frequencies and phases of the various lasers together is illustrated in FIG. 3. The lasers 20 are arranged in an x-y array. Adjacent lasers are spaced relatively far apart along the x axis, and direct their respective laser beams towards coupling prisms 22 located between each pair of lasers in the x direction. This type of structure has been shown to be possible in Liau, et al., "Surface Emitting CaInAsP/InP Laser With Low Threshold Current and High Efficiency", Applied Physics Letters, Volume 46, Page 115 (1985). The prisms deflect their incident laser beams onto a waveguide core 23 which is constructed as previously described, with gratings 24 that deflect the incident beams in the x direction. This cross-couples each of the lasers along each x axis to operate at a common frequency and phase.

Since the lasers emit beams only in the x direction, adjacent lasers in the y direction can be fabricated very close to each other. If the lasers are made close enough together in the y direction, they will establish a common frequency and phase in the y direction by means of "evanescent" wave coupling. This is a known phenomenon by which an "evanescent" wave existing outside the confines of each beam energy couples with adjacent beams which are in close enough physical proximity, causing the beams to lock together in frequency and phase. Evanescent coupling as presently known operates only in a linear array, and its use heretofore has been limited to such arrays. With the present invention, an x-y array of semiconductor lasers can be fabricated such that adjacent lasers frequency and phase lock in one direction through evanescent coupling, as indicated by dashed lines in FIG. 3, with a waveguide and grating structure provided as indicated to frequency and phase lock the lasers in the other direction. Since the various lasers are now tied together in both directions, all of the lasers in the entire array will operate at essentially the same common frequency and phase.

The system illustrated in FIG. 3 has the waveguide structure 23 physically suspended over and spaced from the array of lasers 20. It may also be possible to incorporate the entire waveguide structure into the substrate layers of the two-dimensional laser array to produce a single monolithically integrated structure that is more compact and sturdy.

Figure 4:
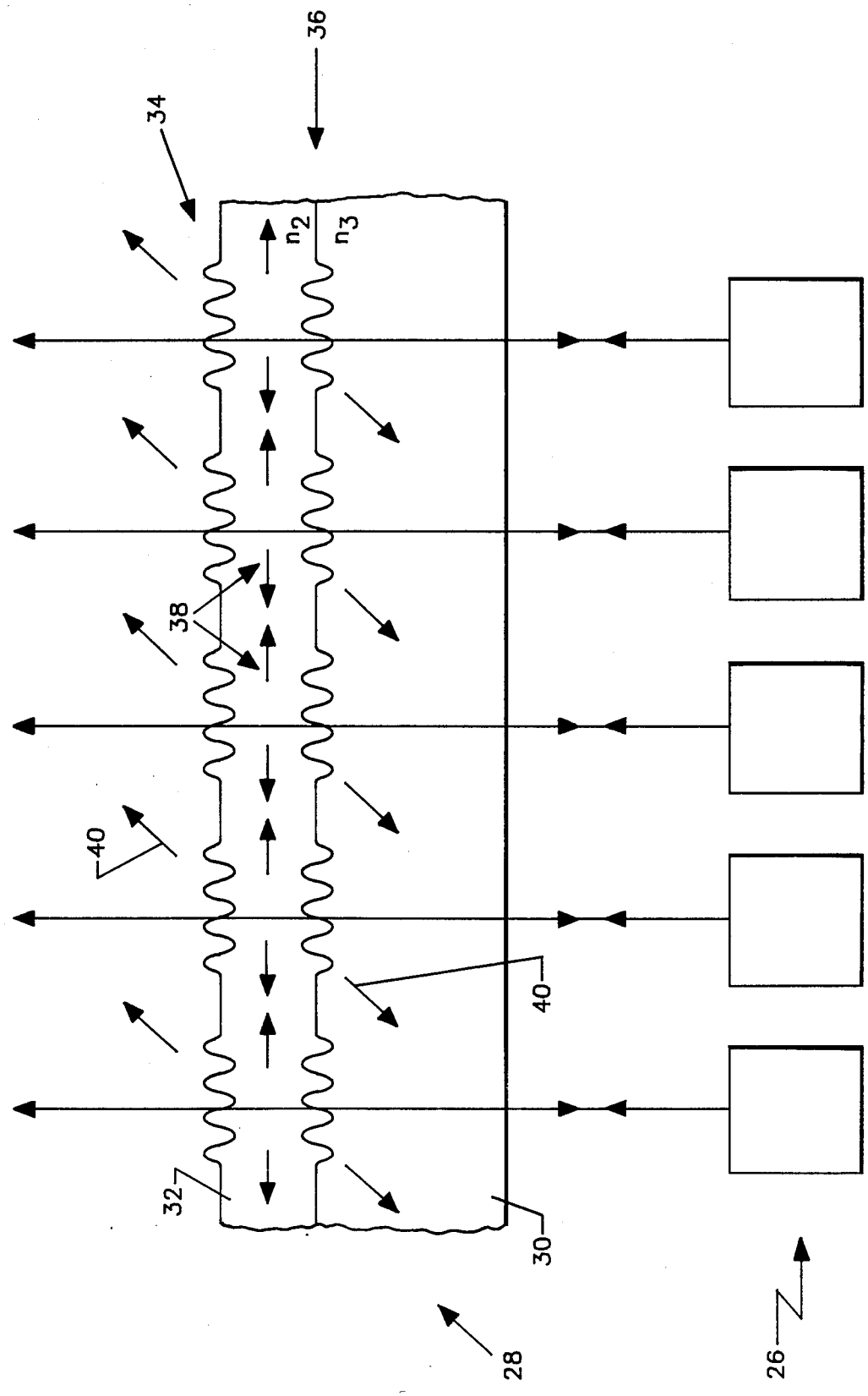
FIG. 4 is a schematic illustration of a laser array and waveguide structure in which a pair of gratings are provided in the waveguide for each laser beam to deflect the beam in two different directions.

Referring now to FIG. 4, another form of the invention is shown in which gratings are used in the waveguide to optically couple the lasers in both directions of a two-dimensional array, rather than using gratings for one direction and evanescent coupling for the other direction. In this embodiment a plurality of lasers 26 are arranged in a two-dimensional array (only one dimension is shown in FIG. 4 for simplification) and a waveguide structure 28 similar to the waveguide shown in FIG. 1 is suspended over the laser array. The waveguide structure 28 includes a transparent substrate 30 and a core 32 with relative indices of refraction as described previously. The upper surface of core 32 has a plurality of spaced gratings 34 aligned with respective beams for the various lasers. Gratings 34 are formed as previously described to deflect portions of their respective laser beams into propagation along the waveguide core in the x direction. This causes a cross-coupling among the lasers in the same x-axis to esstablish a common frequency and phase, as previously described. A second set of gratings 36 is provided on the lower surface of waveguide core 32, again with one grating aligned with each laser beam. Gratings 36 are oriented at an angle of 90° to gratings 34, and deflect portions of their respective laser beams into propagation along the waveguide core 32 in the y-direction. This causes a cross-coupling and resulting common frequency and phase among the lasers along each y axis. (Waveguide propagation along the x axis is indicated by arrows 38, while propagation in the y direction is indicated by arrows 40.) Since all of the lasers along each x-axis have a common frequency and phase, as do the lasers along each y-axis, it follows that all of the lasers in the entire two-dimensional array are provided with a common frequency and phase.

The foregoing description assumes that the lasers are arranged in an x-y matrix. Of course, other laser array formats are possible, in which case the orientation of the various gratings can be adjusted accordingly from the strict x-y alignment described above.

Various embodiments of a system and method for establishing a common frequency and phase for a two-dimensional laser array have thus been shown and described. As numerous variations and alternate embodiments will occur to those skilled in the art, it is intended that the invention be limited only in terms of the appended claims.

I claim:

1. A frequency and phase locking system for an array of lasers which emit beams characterized by a uniform nominal frequency but individual operating frequencies which deviate from the nominal frequency, comprising:
   a substantially laser-transparent waveguide structure substrate surmounted by a waveguide core layer in the path of the beams emitted by the lasers, and
   a plurality of optical gratings formed in the core layer and aligned with respective laser beams to deflect portions of the beams into propagation along the waveguide core and into cross-coupling with other lasers in the array to establish a common operating frequency and phase for the cross-coupled lasers,
   the grating periods being substantially equal to $\lambda/n_1$, and the core thickness being at least equal to approximately $\lambda/(4\sqrt{n_2^2-n_3^2})$, where $\lambda$ is the wavelength of the guided mode, $n_1$ is the effective index of refraction for the guided mode, and $n_2$ and $n_3$ are the indices of refraction of the waveguide core and substrate, respectively.

2. The system of claim 1, wherein the effective depths of the optical gratings are established in a positive proportion to the deviation between the nominal frequency and the individual laser operating frequencies.

3. The system of claim 1, the waveguide core layer comprising a thin film deposited on the substrate layer.

4. The system of claim 1, wherein the waveguide structure is monolithically integrated with the laser array.

5. The system of claim 1, the lasers being arranged in a two-dimensional array, wherein the lasers are positioned close enough to each other in one direction to establish a common operating frequency and phase for adjacent lasers in that direction through evanescent coupling between adjacent lasers, and the waveguide gratings are oriented to establish a common operating frequency and phase among the lasers in another direction.

6. The system of claim 1, the lasers being arranged in a two-dimensional array, wherein said plurality of gratings are oriented to establish a common operating frequency and phase among the lasers along one axis of the matrix, and further comprising a second plurality of optical gratings in the waveguide structure aligned with respective laser beams and oriented to establish a common operating frequency and phase among the lasers in another direction of the array.

7. The system of claim 6, wherein the gratings for the two axes of the laser array are positioned along opposed surfaces of the waveguide structure.

8. The system of claim 1, said gratings comprising a series of corrugations in a surface of the waveguide structure.

9. The system of claim 1, said gratings comprising holographic gratings formed in the waveguide structure.

10. The system of claim 1, wherein the period of each grating is varied along the grating to render the grating responsive to a plurality of different guided modes.

11. A method of locking the frequency and phase of an array of lasers which emit beams characterized by a uniform nominal frequency but individual operating frequencies which deviate from the nominal frequency, comprising the steps of:
    providing a substantially laser-transparent waveguide structure substrate surmounted by a waveguide core layer;
    forming a plurality of optical gratings in the core layer;
    placing the substrate and core layer in the path of the beams emitted by the lasers such that each grating is aligned with one of the laser beams to deflect a portion of the beam into propagation along the waveguide core and into cross-coupling with other lasers in the array, thereby establishing a common operating frequency and phase for the cross-coupled lasers,
    the grating periods being substantially equal to $\lambda/n_1$, and the core thickness being at least equal to approximately $\lambda/(4\sqrt{n_2^2-n_3^2})$, where $\lambda$ is the wavelength of the guided mode, $n_1$ is the effective index of refraction for the guided mode, and $n_2$ and $n_3$ are the indices of refraction of the waveguide core and substrate, respectively.

12. The method of claim 11, wherein the step of forming a plurality of optical gratings further comprises establishing the effective depth of each optical grating in a positive proportion to the deviation between the nominal frequency and the individual laser operating frequencies.

13. The method of claim 11, wherein the waveguide core layer comprises a thin film deposited on the substrate layer.

14. The method of claim 11, wherein the waveguide structure is monolithically integrated with the laser array.

15. The method of claim 11, further comprising the step of:
    arranging the lasers in a two-dimensional array, such that the lasers are positioned close enough to each other in a first direction to establish a common operating frequency and phase for adjacent lasers in the first direction through evanescent coupling between adjacent lasers; and
    wherein the step of forming a plurality of optical gratings further comprises orienting the gratings to establish a common operating frequency and phase among the lasers in a second direction.

16. The method of claim 11, further comprising the steps of:
    arranging the lasers in a two-dimensional array, such that the plurality of gratings is oriented to establish a common operating frequency and phase among the lasers along a first axis of the matrix; and
    forming a second plurality of optical gratings in the waveguide structure aligned with respective laser beams and oriented to establish a common operating frequency and phase among the lasers in a second direction of the array.

17. The method of claim 16, further comprising the step of:
    positioning the gratings for the two axes of the laser array along opposed surfaces of the waveguide structure.

18. The method of claim 11, wherein the step of forming each grating further comprises forming a series of corrugations in a surface of the waveguide structure.

19. The method of claim 11, wherein the step of forming each grating further comprises forming a holographic grating in the waveguide structure.

20. The method of claim 11, wherein the step of forming each grating further comprises varying the period of the grating along the grating to render the grating responsive to a plurality of different guided modes.

* * * * *